(12) United States Patent
Kormaksson et al.

(10) Patent No.: US 10,822,922 B2
(45) Date of Patent: Nov. 3, 2020

(54) RESOURCE IDENTIFICATION USING HISTORIC WELL DATA

(71) Applicant: International Business Machines Corporation, Armonk, NY (US)

(72) Inventors: Matthias Kormaksson, Rio de Janeiro (BR); Marcos Rodrigues Vieira, Rio de Janeiro (BR); Bianca Zadrozny, Rio de Janeiro (BR)

(73) Assignee: International Business Machines Corporation, Armonk, NY (US)

( * ) Notice: Subject to any disclaimer, the term of this patent is extended or adjusted under 35 U.S.C. 154(b) by 843 days.

(21) Appl. No.: 14/599,902

(22) Filed: Jan. 19, 2015

(65) Prior Publication Data

US 2016/0210378 A1 Jul. 21, 2016

(51) Int. Cl.
*E21B 41/00* (2006.01)
*E21B 43/00* (2006.01)

(52) U.S. Cl.
CPC .............. *E21B 41/00* (2013.01); *E21B 43/00* (2013.01)

(58) Field of Classification Search
None
See application file for complete search history.

(56) References Cited

U.S. PATENT DOCUMENTS

| 5,995,906 | A | 11/1999 | Doyen et al. |
| 7,310,579 | B2 | 12/2007 | Ricard et al. |
| 8,275,503 | B2 | 9/2012 | Zhao |
| 9,228,393 | B2 * | 1/2016 | Logan ............... E21B 7/046 |
| 2006/0092766 | A1 * | 5/2006 | Shelley ............ G01V 11/00 367/72 |

(Continued)

FOREIGN PATENT DOCUMENTS

| CN | 101421640 A | 4/2009 |
| CN | 103266881 A1 | 8/2013 |

(Continued)

OTHER PUBLICATIONS

Bellorini, Jean-Paul, Johnny Casas, Patrick Gilly, Philippe Jannes, Paul Matthews, David Soubeyrand, and Juan-Carlos Ustariz. "Definition of a 3D Integrated Geological Model in a Complex and Extensive Heavy Oil Field, Oficina Formation, Faja de Orinoco, Venezuela." In AAPG Annual Meeting 2003. 2003. 6 pages.*

(Continued)

*Primary Examiner* — Omar F Fernandez Rivas
*Assistant Examiner* — Robert S Brock
(74) *Attorney, Agent, or Firm* — Joseph Petrokaitis; Otterstedt, Wallace & Kammer, LLP (57) ABSTRACT

A method for identifying a resource in a field using historic well data including vertical well logs for the resource and historic horizontal well production data for the resource, the method including extracting a plurality of features from the vertical well logs, performing a spatial interpolation of the plurality of features extracted from the vertical well logs onto coordinates of the horizontal well production data to determine a plurality of interpolated features, and building a model predicting production of the resource in the field by regressing the horizontal well production data onto the interpolated features, wherein the model is displayed as a visualization of the resource production predicted in the field.

11 Claims, 3 Drawing Sheets

(56) References Cited

U.S. PATENT DOCUMENTS

| | | | | |
|---|---|---|---|---|
| 2007/0183260 | A1* | 8/2007 | Lee | G01V 11/00 367/25 |
| 2007/0276604 | A1* | 11/2007 | Williams | G01V 1/50 702/16 |
| 2009/0132169 | A1* | 5/2009 | Bordakov | G01V 1/50 702/11 |
| 2011/0024125 | A1 | 2/2011 | Wallace et al. | |
| 2011/0238392 | A1* | 9/2011 | Carvallo | E21B 43/00 703/2 |
| 2012/0084007 | A1* | 4/2012 | Tran | G01V 11/00 702/6 |
| 2012/0250459 | A1* | 10/2012 | Sil | G01V 1/50 367/35 |
| 2012/0253770 | A1 | 10/2012 | Stern et al. | |
| 2013/0020131 | A1* | 1/2013 | Le Ravalec | E21B 43/30 175/50 |
| 2013/0218537 | A1* | 8/2013 | Le Ravalec | G06F 17/5009 703/2 |
| 2013/0346040 | A1* | 12/2013 | Morales German | G06F 17/5009 703/2 |
| 2014/0142906 | A1* | 5/2014 | Berezin | E21B 43/00 703/2 |
| 2014/0156194 | A1* | 6/2014 | Lupin | G01V 1/325 702/11 |
| 2014/0207383 | A1 | 7/2014 | Embid Droz et al. | |
| 2015/0153476 | A1* | 6/2015 | Prange | E21B 43/00 703/2 |
| 2017/0306750 | A1* | 10/2017 | Carpenter | E21B 47/09 |

FOREIGN PATENT DOCUMENTS

| | | |
|---|---|---|
| CN | 104047598 A1 | 9/2014 |
| CN | 105008664 A | 10/2015 |
| EP | 2795527 A1 | 10/2014 |

OTHER PUBLICATIONS

Guevara, Jorge, Matthias Kormaksson, Bianca Zadrozny, Ligang Lu, John Tolle, Tyler Croft, Mingqi Wu, Jan Limbeck, and Detlef Hohl. "A data-driven workflow for predicting horizontal well production using vertical well logs." arXiv preprint arXiv:1705.06556 (2017). 6 pages.*

Jarzyna, J., and M. Kazmierczuk. "Statistics to improve results of well-logging interpretation in reservoir rocks: two cases from the Carpathian foredeep." Proceedings of the XIX CBGA Congress, Thessaloniki, Greece 99 (2010): 141-148.*

Kormaksson, Matthias, Marcos R. Vieira, and Bianca Zadrozny. "A data driven method for sweet spot identification in shale plays using well log data." In SPE Digital Energy Conference and Exhibition. Society of Petroleum Engineers, 2015. 9 pages.*

Lange, Katrine, Thomas Mejer Hansen, Juan Luis Fernández Martínez, Jan Frydendall, and Klaus Mosegaard. "Kriging in High Dimensional Attribute Space using Principal Component Analysis." In 14th Annual Conference of the International Association for Mathematical Geosciences. 2010. 10 pages.*

Mathisen, Trond, Sang Heon Lee, and Akhil Datta-Gupta. "Improved Permeability Estimates in Carbonate Reservoirs Using Electrofacies Characterization: A Case Study of the North Robertson Unit, West Texas." SPE Reservoir Evaluation & Engineering 6, No. 03 (2003): 176-184.*

Moline, Gerilynn R., and Jean M. Bahr. "Estimating spatial distributions of heterogeneous subsurface characteristics by regionalized classification of electrofacies." Mathematical Geology 27, No. 1 (1995): 3-22.*

Rawlinson, Andy, and Shrihari Vasudevan. "Gaussian Process Modeling of Well Logs.", 2015 IEEE European Modelling Symposium, Oct. 2015, 6 pages.*

Authors Unknown, Directional drilling, Chapter 3.2 of vol. I of Encyclopaedia of Hydrocarbons, 2005, pp. 337-353 obtained from http://www.treccani.it/portale/opencms/handle404?exporturi=/export/sites/default/Portale/sito/altre_aree/Tecnologia_e_Scienze_applicate/enciclopedia/inglese/inglese_vol_1/pag337-354ing3.pdf on Jul. 10, 2017.*

Deutsch, C. V., and S. D. Zanon. "Direct prediction of reservoir performance with Bayesian updating under a multivariate Gaussian model." In Canadian International Petroleum Conference. Petroleum Society of Canada, 2004. 8 pages (Year: 2004).*

Da Cruz et al. (Feb. 1, 2004). The Quality Map: A Tool for Reservoir Uncertainty Quantification and Decision Making. Society of Petroleum Engineers. doi:10.2118/87642-PA. 9 pages (Year: 2004).*

Barefoot, Clint. Quantifying and analyzing relationships between well log attributes and production for the Mississippian play in Woods County, OK. Oklahoma State University, May 2014. 79 pages (Year: 2014).*

Hasan, Md Mehedi, Farhana Akter, and Pulok Kanti Deb. "Formation Characterization and Identification of Potential Hydrocarbon Zone for Titas Gas Field, Bangladesh Using Wireline Log Data." International Journal of Scientific & Engineering Research 4, No. 5 (2013): 1512-1518. (Year: 2013).*

Grujic, Ognjen, and Jef Caers. "Model Selection by Functional Decomposition of Multi-Proxy Flow Responses.", SCRF Affiliates Meeting 2014, Stanford University, May 2014, 20 pages (Year: 2014).*

Shang, Han Lin. "A survey of functional principal component analysis." (2011). 38 pages, obtained from https://pdfs.semanticscholar.org/6079/16d2d6c89d65bdb3b0ca59703264803bf593.pdf on May 14, 2018 (Year: 2011).*

Kumar, Abhishek, and Satish K. Sinha. "Total organic carbon prediction for shale gas exploration using statistical clustering, multiple regression analysis." In 10th Biennial International Conference and Exposition, p. 293. 2013. 4 pages (Year: 2013).*

Andersen, M. A. "Discovering the Secrets of the Earth." Defining Logging (2011). 2 pages (Year: 2011).*

Giraldo, R., Pedro Delicado, and Jorge Mateu. "Ordinary kriging for function-valued spatial data." Environmental and Ecological Statistics 18, No. 3 (2011): 411-426 (Year: 2011).*

Goulard, M., and M. Voltz. "Geostatistical interpolation of curves: a case study in soil science." In Geostatistics Troóia'92, pp. 805-816. Springer, Dordrecht, 1993 (Year: 1993).*

Patel, Maulin D., and George A. McMechan. "Building 2-D stratigraphic and structure models from well log data and control horizons." Computers & geosciences 29, No. 5 (2003): 557-567 (Year: 2003).*

OSU Library, E-mail reply to date inquiry, Nov. 6, 2018, 3 pages (Year: 2018).*

Bakulin et al., "Building tilted transversely isotropic depth models using localized anisotropic tomography with well information," Geophysics, vol. 75, No. 4, Aug. 2, 2010, pp. D27-D36.

Caers, "A general algorithm for building 3D spatial laws from lower dimensional structural information." 19th Annual Report, Stanford Center for Reservoir Forecasting, Stanford University, CA, May 8-9, 2006, pp. 1-26.

Cressie, "Statistics for Spatial Data, Revision Edition—Chapter 3, Spatial Prediction and Kriging," J. Wiley, Sep. 1993, pp. 103-208.

Perez et al., "Evaluation of fractal models to describe reservoir heterogeneity and performance," SPE Formation Evaluation 12.01, Mar. 1997, pp. 1-3 (Abstract only).

Yao et al., "Integration of seismic attribute map into 3D facies modeling," Journal of petroleum science and engineering 27.1, Jul. 2000, pp. 1-2 (Abstract only).

Tank et al., "Targeting Horizontal Wells—Efficient Oil Capture and Fracture Insights," SPE Reservoir Evaluation & Engineering 2.02, Apr. 1999, pp. 1-3 (Abstract only).

Tingting Yao et al, "Integration of seismic attribute map into 3D facies modeling," Journal of petroleum science and engineering 27.1, Jul. 2000, pp. 69-84.

W.J. Tank et al, "Targeting Horizontal Wells—Efficient Oil Capture and Fracture Insights," SPE Reservoir Evaluation & Engineering 2.02, Apr. 1999, pp. 180-185.

(56) References Cited

OTHER PUBLICATIONS

Godofredo Perez et al, "Evaluation of fractal models to describe reservoir heterogeneity and performance," SPE Formation Evaluation 12.01, Mar. 1997, pp. 65-72.
Matthias Kormaksson et al., unpublished U.S. Appl. No. 14/986,498, filed Dec. 31, 2015, Resource Identification Using Historic Well Data, pp. 1-20 and 5 sheets of drawings.
List of IBM Patents or Applications Treated As Related, 2 pages.
Chinese Patent Office—Office Action dated Jul. 17, 2018, 5 pages, CN Appln 201610022708.6.

* cited by examiner

RESOURCE IDENTIFICATION USING HISTORIC WELL DATA

BACKGROUND

The present disclosure relates to methods for identifying natural resources stored in the ground, and more particularly to a method for identifying natural resources using historic well data.

Interest in shale plays previously exhausted by vertical wells, or brown fields, has grown with the advent of horizontal drilling techniques. These brown fields are believed to have potential if developed with horizontal wells. In fact, several such brown fields are already being drilled using horizontal techniques with good results. However, with high drilling costs, the siting of extraction equipment for new wells at "sweet spots," or sites with high potential, is important.

BRIEF SUMMARY

According to an exemplary embodiment of the present invention, a method for identifying a resource in a field using historic well data including vertical well logs for the resource and historic horizontal well production data for the resource, the method including extracting a plurality of features from the vertical well logs, performing a spatial interpolation of the plurality of features from the vertical well logs onto coordinates of the horizontal well production data to determine a plurality of interpolated features, and building a model predicting production of the resource in the field by regressing the horizontal well production data onto the interpolated features, wherein the model is displayed as a visualization of the resource production predicted in the field.

BRIEF DESCRIPTION OF THE SEVERAL VIEWS OF THE DRAWINGS

Preferred embodiments of the present invention will be described below in more detail, with reference to the accompanying drawings.

DETAILED DESCRIPTION

According to an exemplary embodiment of the present invention, a set of features are automatically extracted from complex and high-dimensional well log curves, which are historic records from vertical wells, wherein the extracted features are used to build one or more predictive models. These predictive models identify sweet spots in resource reserves (e.g., shale plays) by associating the extracted features from historic well logs of the vertical wells with production data from horizontal wells. A visualization of the predictive model can be output for further analysis.

Geological and petrophysical studies have shown that the identification of sweet spots in shale plays involves finding locations with certain combinations of parameters, such as thickness, TOC (total organic carbon), maturity, porosity, and high gas-in-place. Exemplary embodiments of the present invention leverage historic well data, which is widely available for many locations (e.g., tens or hundreds of thousands of data points for some reservoir fields), for an automatic, efficient, and robust method of identifying one or more sweet spots in a given reservoir field One or more exemplary embodiments of the present invention use a principled framework for extracting simple and meaningful features from complex and high-dimensional well log curves.

In the present disclosure the phrase "well log" refers to information about vertical wells and the phrase "well data" refers to information about vertical and/or horizontal wells. Further, it should be understood that production can be measured by any relevant method. For example, a typical unit of production is volume during a specified period, e.g., 6 months of production, and can be measured as a number of barrels. The specified period can be any time period of interest (1-month, 3-month, 6-month, etc.).

No method is known to exist for extracting such features from high-dimensional and complex well log curves. Summary statistics such as means, maximum or minimum peak heights are too simple to capture relevant features from the well log curves. Further, such summary statistics are necessarily ad hoc, and would lead to variability in modeling results. In contrast, according to one or more embodiments of the present invention, a principled statistical approach automatically extracts features according to a total variation criteria.

Exemplary embodiments of the present invention can be used to build one or more predictive models related to the production of a natural resource using historic production data and well logs (e.g., petrophysical well logs or hydrophysical well logs) alone, without a geological core analysis. More particularly, according to one or more embodiments of the present invention, a method includes extracting one-dimensional features from each of a plurality of well log curves, wherein the one-dimensional features are interpolated onto the coordinates of the horizontal well production data using 2D interpolation (as opposed to more difficult 3D interpolations). This is advantageous in situations where seismic data is not available. By regressing historic production data from horizontal wells on the interpolated extracted features from the vertical wells, production can be directly predicted at new locations in the reservoir field. At least in the case of petrophysical well logs, this has the advantage over 3D interpolations of the petrophysical properties that may or may not correlate well with production and may later need to be analyzed by geological experts.

Figure 1:
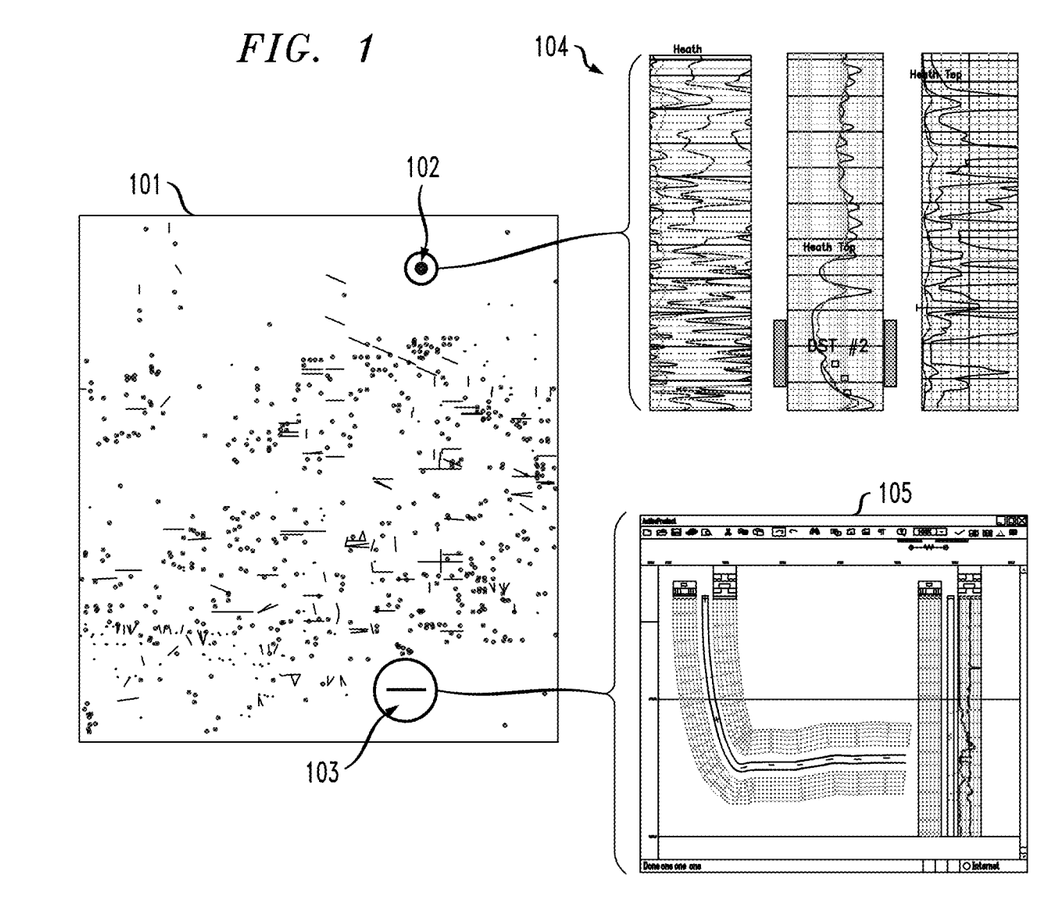
FIG. 1 is a visualization of data for vertical and horizontal wells according to an exemplary embodiment of the present invention.
Figure 2:
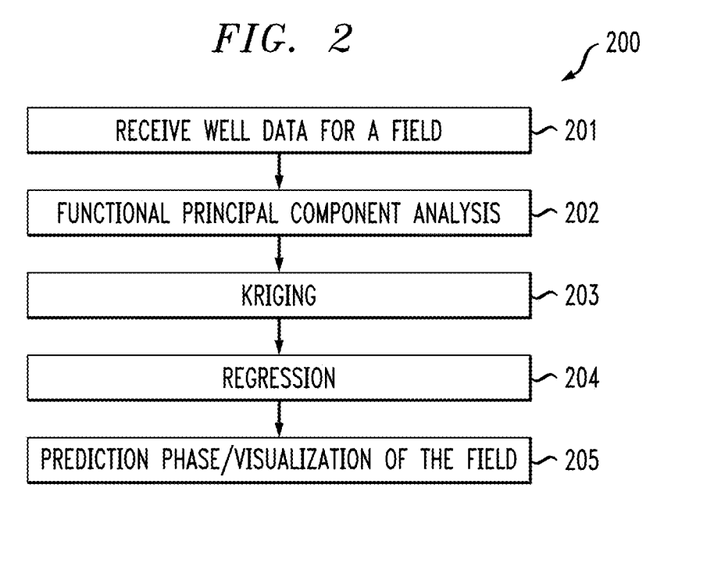
FIG. 2 is a flow diagram of a method for predicting resource reserves according to an exemplary embodiment of the present invention.
Figure 3:
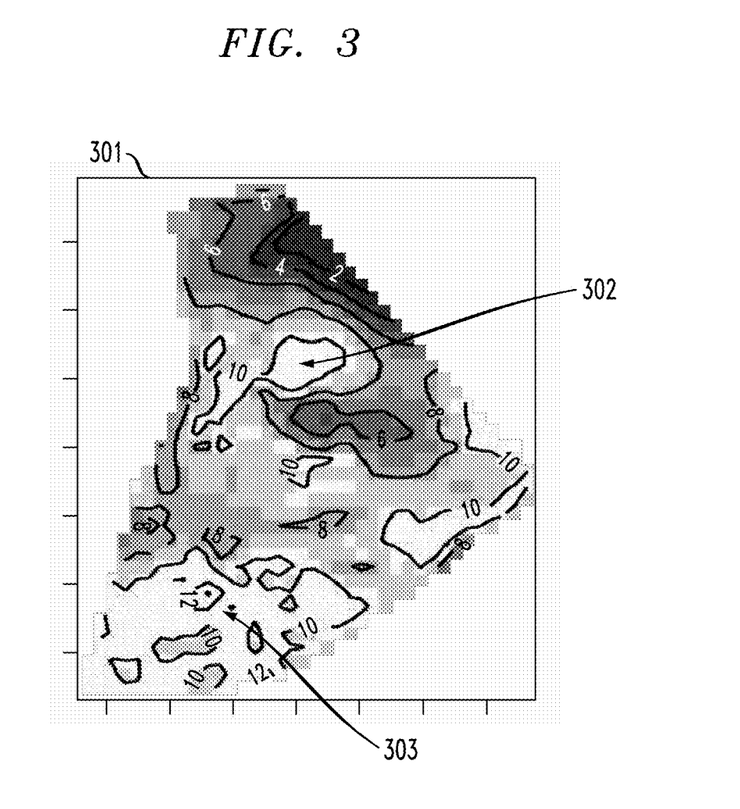
FIG. 3 shows a visualization corresponding to FIG. 2, according to an exemplary embodiment of the present invention.

A workflow for predicting production (e.g., identifying sweet spots) in a given reservoir field is illustrated in FIGS. 1-3. In the example, the reservoir field includes a plurality of vertical wells associated with physical well logs and a plurality of horizontal wells for which production data is available.

Referring to FIG. 1, a reservoir field is given as a map 101 of vertical wells denoted by dots, e.g., 102, and horizontal wells denoted by lines, e.g., 103. Note that in FIG. 1, the horizontal wells are not located at the same coordinates as the vertical wells. Well logs 104 are associated with each of the vertical wells and production data 105 is associated with each of the horizontal wells.

Each vertical well is associated with one or more well logs. Each well log gives some physical measurement(s) along the depth of a corresponding well. The vertical well log data includes one or more of the following per depth: deep resistivity, gamma radiation, sonic transit time, density porosity, sonic porosity, neutron porosity, bulk density, and spontaneous potential. It should be understood that the method may also be applied to other types of physical well log curves.

Each horizontal well is associated with historic production data (e.g., oil, gas, or water production). As shown in FIG. 2, a method 200 for building a predictive model includes receiving well data of a plurality of vertical wells and a plurality of horizontal wells 201, the systematic extraction of one-dimensional features from the well logs of the vertical wells using a functional Principal Components Analysis (fPCA) 202, determining a weighted average of the one-dimensional features across the vertical wells by kriging 203, and performing a regression of the historic production data from the horizontal wells on the interpolated extracted features from the vertical wells 204, and outputting the predictive model 205. Production prediction can be performed on a grid across a portion of an entire production field using the predictive model, thus facilitating map visualization.

FIG. 3 is an exemplary visualization 301 showing production prediction on a grid across a portion of an entire production field and one or more predicted sweet spots (e.g., 302 and 303). It should be understood that a sweet spot in the grid can be identified based on a threshold for production, either absolute or relative to the surrounding area.

The analytic workflow (FIG. 2) includes a model building phase and a prediction phase. As will be described below, the modeling phase regresses interpolated principal components X onto the production y. This produces a model y=X*beta where beta is estimated in the modeling phase. The prediction phase chooses a new location where a prediction is desired and interpolates the principal components onto that new location, wherein the interpolated value is X_new. The prediction can be achieved by determining y_new=X_new*beta (beta from the model).

The model building phase is illustrated by FIG. 2 and includes blocks 202-204. Given the historic well data received at block 201, an fPCA is used at block 202 to extract one-dimensional features, which are the principal component scores, from each of the physical well log curves. Stated another way, K principal component scores are extracted for each of the physical properties. The number K of principal components to be extracted for each physical curve can be chosen according to a proportion of the total variation in the curves explained by the first K components.

Theoretically, there are infinite principal component scores $\rho_i$, i=1, . . . , ∞. The sum of the variances of these principal component scores equals the (integrated) total variation in the curves, which is given by: $\int \text{var}(x(t)) dt = \sum_{i=1}^{\infty} \text{var}(\rho_i)$, wherein x(t) is a given curve describing a parameter of the well log. Therefore, by choosing all (infinite) principal component scores, 100% of the total variation in the curves can be explained. In practice, the first K principal components are chosen until the proportion $\sum_{i=1}^{k} \text{var}(\rho_i)/\sum_{i=1}^{\infty} \text{var}(\rho_i)$ is higher than some threshold, e.g. 80%. It should be understood that the threshold can be selected by a user for a specific application.

Figure 4:
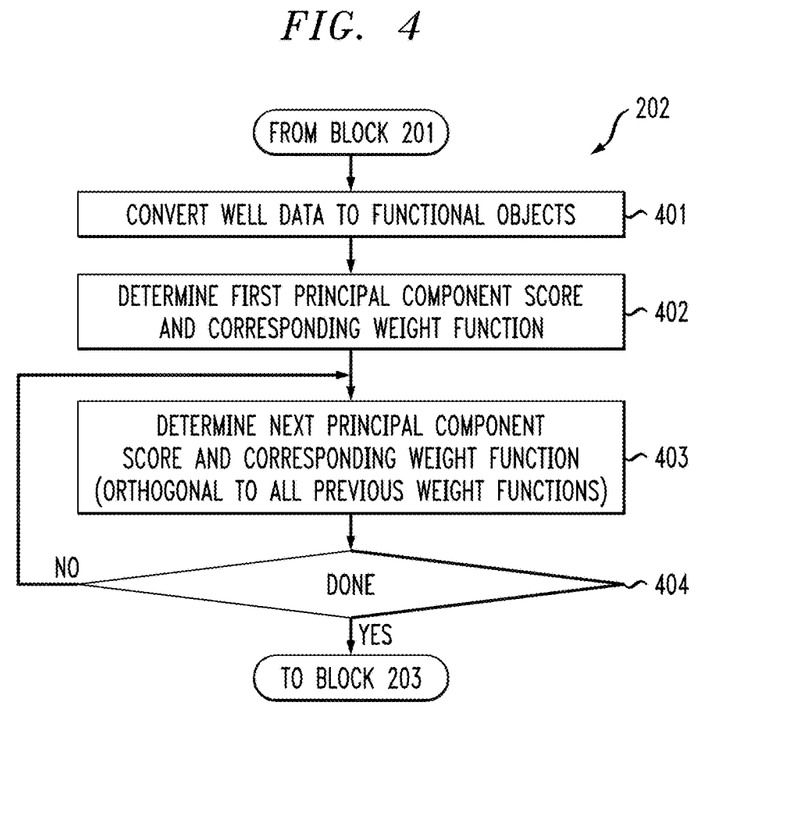
FIG. 4 is a flow diagram of a method for a functional Principal Components Analysis (fPCA) for extracting features from well data according to an exemplary embodiment of the present invention.

Referring to the fPCA at block 202 (FIG. 2 and FIG. 4), the physical well log curves (e.g., resistivity, sonic porosity, gamma radiation) include discrete observations $x_j$, observed at discrete depths $d_j$, j=1, . . . , p, where p is the number of depth units observed. Since the number of depth units can be in the thousands, and since the scatterplots $(d_j, x_j)$ demonstrate smooth functional relationships, this data can be represented as functions. This facilitates the use of a Functional Data Analysis, which can be used to extract (functional) principal components from the curves. The functions can be represented using a linear expansion:

$$x(d) = \sum_{k=1}^{K} c_k \varphi_k(d),$$

where $\varphi_k(\cdot)$ represent known basis functions (e.g., Fourier basis or B-spline basis functions). The coefficients $c_k$ are calculated as part of the preprocessing of the data. This leads to an efficient computational representation of the discrete data as functional objects, where the data for each well have been reduced from thousands of measurements to only K<<p coefficients ($c_k$) and known basis functions ($\varphi_k$). In an exemplary implementation, this can readily be achieved using publically available statistical applications, such as the "fda" R-package (a language and environment for statistical computing and graphics).

Assuming that the well logs have all been converted to functional objects $x_1(\cdot), \ldots, x_n(\cdot)$ at 401, where n denotes the number of vertical wells in the field, the fPCA includes finding principal component weight function $\xi_1(\cdot)$ at 402 for which the principal component scores:

$$\rho_{1i} = \int \xi_1(t) x_i(t) dt,$$

maximize $\Sigma_i \rho_{1i}^2$ subject to:

$$\int \xi_1^2(t) dt = 1.$$

At 403, the fPCA includes determining, sequentially, weight functions $\xi_k(\cdot)$, k≥2 such that $\Sigma_i \rho ki^2$ is maximized, where $\rho_{ki} = \int \xi_k(t) x_i(t) dt$ are the k-th principal component scores. The k-th corresponding weight function is additionally required to be orthogonal to all previously calculated weight functions, i.e., $\int \xi_k(t) \xi_j(t) dt = 0$ for all j=1, . . . , k−1. The computation of functional principal component scores at 403 can also be performed using a configured commercial statistical application.

The fPCA continues determining orthogonal weight functions until desired number of principal component scores is determined (see 404).

The model building phase further includes kriging at block 203, which interpolates the extracted features at the vertical wells onto the coordinates of the horizontal wells. In one exemplary embodiment, since the horizontal wells extend outward, center coordinates of the horizontal wells can be used. It should be understood that other locations along or near the horizontal wells can be used as the coordinates, depending on user preferences.

Referring more particularly to block 203, let H and V denote a set of horizontal wells and a set of vertical wells, respectively. The k-th principal component score (for a given physical parameter) calculated at vertical well i ∈ V is denoted by $x_{ik}$(k=1, . . . , K). Kriging determines a weighted average of the principal component scores across the set of vertical wells. More particularly, for a horizontal well i' and principal component score k, a weighted average is determined as:

$$\hat{x}_{i'k} = \sum_{i \in V} \text{weight}(dist_{i,i'}) \cdot x_{ik}, \quad (1)$$

where $dist_{i,i'}$ denotes the distance between vertical well $i \in V$ and horizontal well $i'$. The kriging weights can be obtained by using a configured commercial statistical application.

According to an exemplary embodiment of the present invention, the model building phase further includes performing a Regression at block 204. Regression is a statistical process for estimating the relationships between dependent variables y and independent variables x. According to an exemplary embodiment of the present invention, the dependent variable is $y_{i'}$, which denotes the production (e.g., 6-month production or any meaningful summary of well production) at horizontal wells $i' \in H$, and the independent variables are the interpolated principal component scores $\hat{x}_{i'1}, \ldots, \hat{x}_{i'K}$ at the horizontal wells $i' \in H$. The interpolated principal component scores are regressed on $y_{i'}$ through a selected regression model (e.g., Multiple Linear Regression (MLR), Support Vector Machine, Neural Networks, LASSO). In one exemplary implementation, the MLR model is described by:

$$y_{i'} = \beta_0 + \Sigma_{k=1}^{K} \hat{x}_{i'k} \beta_k, \quad (2)$$

where model parameter estimates $\hat{\beta}$ are obtained through least squares.

At block 204, by regressing historic production at the horizontal wells onto the interpolated principal component scores, one or more predictive models are built that can be used to predict production at new sites in the reservoir field.

Assume now, a user wishes to drill a new horizontal well $i_0 \in H$ at a new location (or on a grid of such new locations) whose spatial coordinates are known. This is called the prediction phase (block 205) and involves interpolating the principal component scores onto the new site $i_0$ (or on a grid of such locations) through $\hat{x}_{i_0k} = \Sigma_{i \in V} \text{weight}(dist_{i,i_0}) \cdot x_{ik}$, using Kriging as described herein. The estimated Regression model (e.g., the estimated MLR model from (2)) is used to form the predicted production at the new horizontal well(s):

$$\hat{y}_{i_0} = \hat{\beta}_0 + \sum_{k=1}^{K} \hat{x}_{i_0k} \hat{\beta}_k.$$

In view of the foregoing, once the model building phase is complete, a prediction of production can be performed at any given location in the reservoir field. In the prediction phase (block 205), the extracted principal components from the fPCA 202 are interpolated (using the kriging 203) onto the new locations, where predicted production is desired. The estimated regression model from 204 is then used to predict the production using the interpolated principal components as input to the model. This prediction can be performed at any individual location or on a grid across an entire field. In the case of an area wide prediction (e.g., for a portion of the entire reservoir field), the area can be visualized with contour and/or color maps that provide the user with a visual representation of predicted production across the reservoir field. This permits the user to identify locations with high production potential, i.e., sweet spots.

By way of recapitulation, according to an exemplary embodiment of the present invention, a method for identifying a resource in a field using historic well data including vertical well logs for the resource and horizontal well production data for the resource includes extracting a plurality of features from the vertical well logs, performing a spatial interpolation of the plurality of features extracted from the vertical well logs onto coordinates of the horizontal well production data to determine a plurality of interpolated features, and building a model predicting production of the resource in the field by regressing the horizontal well production data onto the interpolated features, wherein the model is displayed as a visualization of the resource production predicted in the field.

In one or more embodiments, the method further comprises receiving the vertical well logs including at least one physical property measured at a plurality of depth, wherein each physical property includes one of deep resistivity, gamma ray, sonic transit time, density porosity, sonic porosity, neutron porosity, bulk density, spontaneous potential, and wherein each of the extracted features corresponds to one parameter. In one or more embodiments, the vertical well logs each include data of at least one physical property measured at a plurality of depth, and further wherein extracting the plurality of features from the vertical well logs further comprises determining a plurality of functional principal component scores for each of the physical properties from the vertical well logs. In one or more embodiments, the method further includes receiving coordinates of a new location in the field without an existing well, and predicting production at the new location using the model, wherein the prediction of the production at the new location uses an interpolation of the functional principal component scores from the vertical well logs. In one or more embodiments, the model predicts horizontal well production.

In one or more embodiments, extracting the plurality of features from the vertical well logs further includes determining a plurality of functional principal component scores as weighted integrals of curves in the vertical well data, with weighting functions controlling a sample variance of corresponding integrals across the vertical well logs. In one or more embodiments, performing the spatial interpolation of the plurality of features from the vertical well logs onto the coordinates of the horizontal well production data is performed by Kriging. In one or more embodiments, method further includes describing the location of the horizontal well production data by center coordinates of the horizontal well production data.

The methodologies of embodiments of the disclosure may be particularly well-suited for use in an electronic device or alternative system. Accordingly, embodiments of the present invention may take the form of an entirely hardware embodiment or an embodiment combining software and hardware aspects that may all generally be referred to herein as a "processor," "circuit," "module" or "system."

Furthermore, it should be noted that any of the methods described herein can include an additional step of providing a system for predicting and visualizing resource reserves. Further, a computer program product can include a tangible computer-readable recordable storage medium with code adapted to be executed to carry out one or more method steps described herein, including the provision of the system with the distinct software modules.

Figure 5:
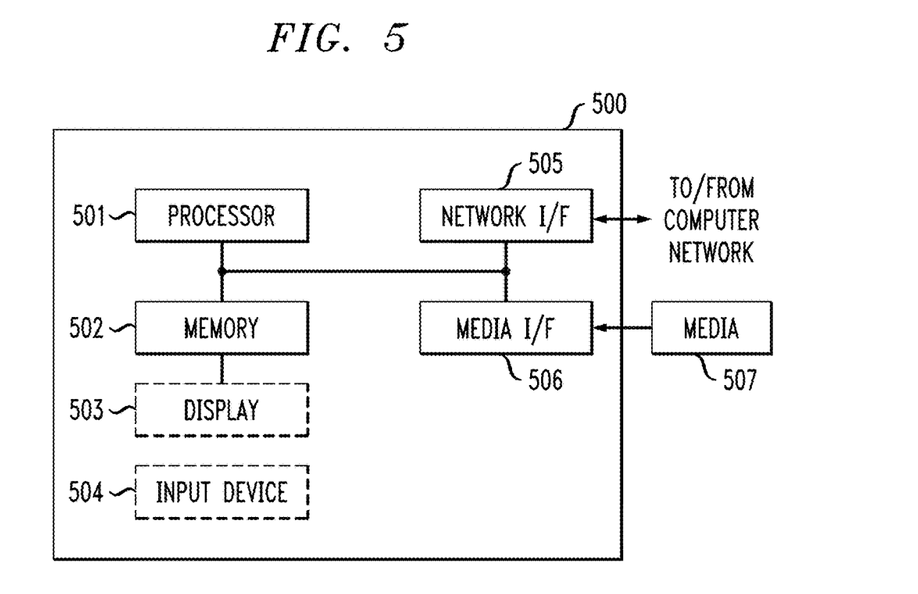
FIG. 5 is a diagram of a computer system configured for predicting and visualizing resource reserves according to an exemplary embodiment of the present invention.

Referring to FIG. 5; FIG. 5 is a block diagram depicting an exemplary computer system 500 for predicting and visualizing resource reserves according to an embodiment of the present invention. The computer system shown in FIG. 5 includes a processor 501, memory 502, display 503, input device 504 (e.g., keyboard), a network interface (I/F) 505, a media (I/F) 506, and media 507, such as a signal source, e.g., camera, Hard Drive (HD), external memory device, etc.

In different applications, some of the components shown in FIG. 5 can be omitted. The whole system shown in FIG. 5 is controlled by computer readable instructions, which are generally stored in the media 507. The software can be downloaded from a network (not shown in the figures), stored in the media 507. Alternatively, software downloaded from a network can be loaded into the memory 502 and executed by the processor 501 so as to complete the function determined by the software.

The processor 501 may be configured to perform one or more methodologies described in the present disclosure, illustrative embodiments of which are shown in the above figures and described herein. Embodiments of the present invention can be implemented as a routine that is stored in memory 502 and executed by the processor 501 to process the signal from the media 507. As such, the computer system is a general-purpose computer system that becomes a specific purpose computer system when executing routines of the present disclosure.

Although the computer system described in FIG. 5 can support methods according to the present disclosure, this system is only one example of a computer system. Those skilled of the art should understand that other computer system designs can be used to implement embodiments of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A computer program product for automatically visualizing a resource in a field, the computer program product comprising a computer readable storage medium having program instructions embodied therewith, the program instructions executable by a processor to cause the processor to perform a method comprising:
    recording horizontal well production data for the resource extracted using horizontal wells in the field;
    extracting a plurality of one-dimensional features from vertical well logs comprising data gathered during a previous recovery of the resource extracted using vertical wells in the field, wherein the vertical well logs each include data of at least one physical property measured at a plurality of depths, wherein extracting the plurality of features from the vertical well logs further comprises determining a number of functional principal component scores as weighted integrals of curves in the vertical well data;
    performing a two-dimensional spatial interpolation of the plurality of features extracted from the vertical well logs onto coordinates of the horizontal well production data to determine a plurality of interpolated functional principal component scores by Kriging the functional principal component scores onto the coordinates of the horizontal well production data;
    building a model of the resource at a plurality of locations in the field, wherein the model includes a function capturing a regression of the horizontal well production data onto the interpolated functional principal component scores;
    receiving coordinates of a new location in the field without an existing well; and
    predicting production at the new location by Kriging the functional principal component scores from the vertical well logs onto the new location using the function, wherein the model is displayed as a visualization of the resource in the field, and wherein the visualization further includes the predicted production of the resource at the new location.

2. The computer program product of claim 1, further comprising receiving the vertical well logs including at least one parameter measured at a plurality of depths, wherein each parameter includes one of deep resistivity, gamma ray, sonic transit time, density porosity, sonic porosity, neutron porosity, bulk density, spontaneous potential, and wherein each of the extracted features corresponds to one parameter.

3. The computer program product of claim 1, wherein the plurality of one-dimensional features extracted from the vertical well logs are the functional principal component scores.

4. The computer program product of claim 3, wherein determining the interpolated functional principal component scores comprises determining, for each of the horizontal wells, a value using the plurality of functional principal component scores extracted from the vertical well logs, distances to each of the vertical wells associated with the functional principal component scores extracted, and a kriging weight on the distances, wherein a location of the horizontal well production data used in calculating the distances is described by coordinates of respectives ones of the horizontal wells.

5. The computer program product of claim 4, wherein the regression of the horizontal well production data onto the interpolated functional principal component scores comprises estimating a relationship between the horizontal well production data for a given time period and the interpolated functional principal component scores at the horizontal wells determined from the plurality of functional principal component scores extracted from the vertical well logs.

6. The computer program product of claim 1, wherein the function is applied to predict horizontal well production at the new location given the one-dimensional features from the vertical well logs.

7. The computer program product of claim 1, where the functional principal component scores explain a portion of a total variation in the vertical well logs, with weighting functions controlling a sample variance of corresponding integrals across the vertical well logs, wherein the number of functional principal component scores is controlled by a threshold on the portion of the total variation explained by the functional principal component scores.

8. The computer program product of claim 1, wherein the Kriging further comprises determining, for each of the horizontal wells, a value using the functional principal component scores for the vertical wells, distances to each of the vertical wells, and a kriging weight on the distances, wherein a location of the horizontal well production data used in calculating the distances is described by center coordinates of respectives ones of the horizontal wells.

9. The computer program product of claim 1, wherein the visualization is displayed as a grid map across a portion of the field showing the predicted production of the resource at the new location in the portion of the field.

10. The computer program product of claim 9, further comprising:
    identifying at least one sweet spot in the field using the predicted production of the resource at the new location and a threshold for predicted production; and
    distinguishing the at least one sweet spot in the grid map.

11. The computer program product of claim 1, further comprising extracting the resource from the new location.

* * * * *